United States Patent [19]

De Kort et al.

[11] Patent Number: 5,399,978

[45] Date of Patent: Mar. 21, 1995

[54] PROBE APPARATUS AND METHOD FOR MEASURING HIGH-FREQUENCY SIGNALS

[75] Inventors: Cornelis G. C. M. De Kort; Joris J. Vrehen, both of Eindhoven, Netherlands

[73] Assignee: U.S. Philips Corporation, New York, N.Y.

[21] Appl. No.: 23,540

[22] Filed: Feb. 26, 1993

[30] Foreign Application Priority Data

Mar. 3, 1992 [EP] European Pat. Off. ............ 92200608

[51] Int. Cl.$^6$ ............................................. G01R 31/02
[52] U.S. Cl. ................................. 324/676; 324/72.5; 324/149; 324/753; 324/754
[58] Field of Search .................... 324/72.5, 149, 158 P, 324/676, 678, 690, 753, 754, 765, 769

[56] References Cited

U.S. PATENT DOCUMENTS

| | | | |
|---|---|---|---|
| 3,405,361 | 10/1968 | Kattner et al. | 324/158 P |
| 3,944,921 | 3/1976 | Tsuda et al. | 324/133 |
| 4,065,717 | 12/1977 | Kattner et al. | 324/158 P |
| 4,218,618 | 8/1980 | Mourou | 250/214 R |
| 4,310,794 | 1/1982 | Maier | 324/676 |
| 4,446,425 | 5/1984 | Valdmanis et al. | 324/76.36 |
| 4,468,610 | 8/1984 | Hanson | 324/676 |
| 4,851,767 | 7/1989 | Halbout et al. | 324/158 P |

FOREIGN PATENT DOCUMENTS 324110 7/1989 European Pat. Off. ..
382610 8/1990 European Pat. Off. ..

OTHER PUBLICATIONS

1991 IEEE Int. Symp. on Circuits and Systems, vol. 5, Jun. 1991, "A Bridge Type Optoelectronic Sample and Hold Circuit" by C. K. Sun et al.

Laser Focus, vol. 19, No. 12, Dec. 1983, by S. Letzter "Advances in Boxcar Averaging Using Digital Techniques".

Primary Examiner—Kenneth A. Wieder
Assistant Examiner—Glenn W. Brown
Attorney, Agent, or Firm—Bernard Franzblau

[57] ABSTRACT

A probe apparatus includes a probe contact connected to a storage capacitance via a photoconductive switch. The photoconductive switch can be operated at high speed by means of a pulsed laser. The laser pulses (L) are synchronized with a moment in the operation cycle of the circuit at which moment the voltage at the point under test is to be measured. After a number of pulses and operation cycles the storage capacitance is charged to the voltage value (V) to be measured. Then, the capacitance does not form a load on the point under test and the voltage (V) can be determined accurately.

15 Claims, 2 Drawing Sheets

PROBE APPARATUS AND METHOD FOR MEASURING HIGH-FREQUENCY SIGNALS

BACKGROUND OF THE INVENTION

This invention relates to a pro,be apparatus for measuring electrical signals in an electrical circuit comprising at least one electrical contact for contacting a selected point of the electrical circuit, said electrical contact being coupled to a first terminal of a switch responsive to electromagnetic radiation, the probe apparatus further comprising means for generating electromagnetic radiation and applying it to said switch for switching the same. In particular, the present invention relates to such a probe apparatus for measuring high-frequency signals in integrated circuits and other electronic circuits. The invention further relates to a method for measuring electrical signals in integrated and other circuits.

A probe apparatus according to the introductory paragraph is known from EP-A 0 324 110, which corresponds to U.S. Pat. No. 4,851,767 (Jul. 25, 1989). In this document a probe is disclosed in which an electrical contact for contacting a point in the circuit under test is directly coupled to electrically conductive wiring of the probe where a signal is sampled via a photoconductive gap responsive to radiant energy. The known device comprises a laser and an optical system for transmitting light from the laser onto the photoconductive gap. As the laser pulses can be made very short, a probe for high speed measurement is provided.

The known document leaves the effects of signal detection on the circuit under test out of consideration. However, the load consisting of the probe and the circuitry immediately following it may influence the signal levels in the circuit and consequently the accuracy of the measurement. For example, an ohmic load of the photoconductive switch causes a current to be drawn from the test point and a change of the voltage level at that point.

SUMMARY OF THE INVENTION

It is, inter alia, an object of the invention to provide a probe apparatus according to the introductory paragraph in which a high sampling frequency and bandwidth are combined with a very low load, which does not influence the voltage level of the point under test. It is also an object of the invention to provide a method for using such a probe apparatus.

To this end, a probe apparatus according to the invention is characterized in that a second terminal of said switch is connected to a capacitance for the storage of an electrical quantity tapped from said selected point. The probe apparatus does not comprise an ohmic load as a part of the measurement circuitry, so no continuous current is drawn during a measurement. In general, the load is limited by the size of the capacitance. A suitable capacitance for this purpose is the input capacitance of a properly dimensioned field effect transistor (FET). The FET is simultaneously to be used as the input transistor of a preamplifier. The switching speed can be very high as it is not determined by the switching speed of the FET, but by the radiation source and the reaction time of the photoconductive switch. These switching speeds are sufficient to achieve very short sampling times and a high bandwidth.

It is remarked that it is known per se, from EP-A 0 382 610, which corresponds to U.S. Pat. No. 5,012,084 (Apr. 30, 1991), to use a high-speed transistor, of which the gate is photosensitive, in combination with a storage capacitance. The known circuit, however, does not concerns a probe apparatus for the measurement of electrical, integrated or other circuits, but rather a circuit for the sampling of an analog signal. There is no indication in the known document that the load of the sampling circuit should be limited in order not to disturb the signal to be measured.

A preferential embodiment Of the probe apparatus in accordance with the invention is characterized in that the means for generating electromagnetic radiation comprises a control circuit for generating radiation pulses synchronous with the occurrence of electrical signals to be measured in the electrical circuit. If the circuit under test is a circuit in which the electrical signals are repetitive, the voltage at each point in the circuit will be repeated with a certain repetition frequency. This may be the clock frequency at which the circuit is operated or the repetition time may be a number of clock periods. If the radiation source is operated at the same repetition frequency, the photoconductive switch connects the storage capacitance with the point to be measured each time that the same voltage is present at that point. With the occurrence of each radiation pulse the capacitance is further charged until, after a number of pulses, the capacitance voltage is substantially equal to the voltage at the point under test at the selected moment in the operation cycle. No current is drawn any more from the circuit and the storage capacitance no longer forms a load on the circuit. The only additional load is the capacitance of the probe itself and of the photoconductive switch. The voltage in the circuit is determined by measuring the voltage at the storage capacitor when this stage is reached.

For an accurate measurement of a voltage at the selected moment within an operation cycle of the circuit under test, the probe apparatus is characterised in that the control circuit is arranged for to generate pulses with a pulse length considerably shorter than one clock period for clocking the electrical circuit. The time resolution of the voltage measurement is the length of the radiation pulse. Preferably, the probe apparatus is provided with adjustable means to adapt the relative timing of the radiation pulses in order to measure a desired section of signals in the circuit under test. Repeating the measurements with a different timing provides a measurement of the signal profile.

An embodiment of the invention is characterized in that the electrical contact is arranged at one end of an optical fibre of which the other end is optically coupled to the means for generating electromagnetic radiation, and in that a photoconductive material is arranged in between the optical fibre and the electrical contact. This provides a small probe with a low capacitance in the tip.

A method according to the invention for measuring an electrical signal in an electrical circuit includes contacting a point of the electrical circuit by a probe comprising a contact coupled to a storage capacitance via a switch, the switch being made conductive during a plurality of time intervals. Each time interval is considerably shorter than one clock period for clocking the circuit. In this method the intervals in which the switch is made conductive is synchronised with the operation cycle of the circuit. According to this method the storage capacitance is charged partially during each operation cycle. After a plurality of cycles, the storage capacitance will be charged to the full value of the voltage at the measured point in the circuit and the moment within a cycle. This makes it possible to perform a measurement in a circuit that is operated at a frequency higher than the :charging time of the storage capacitance. It also allows measurement of points in the circuit at which the electrical values have small tolerances. Initially, only a fraction of the charge has to be tapped during each cycle and after a number of cycles no charge,flows into the storage capacitance any more.

BRIEF DESCRIPTION OF THE DRAWING

These and other more detailed aspects of the invention will now be elucidated by way of example with reference to the accompanying drawings, in which.

DESCRIPTION OF THE PREFERRED EMBODIMENTS

Figure 1:
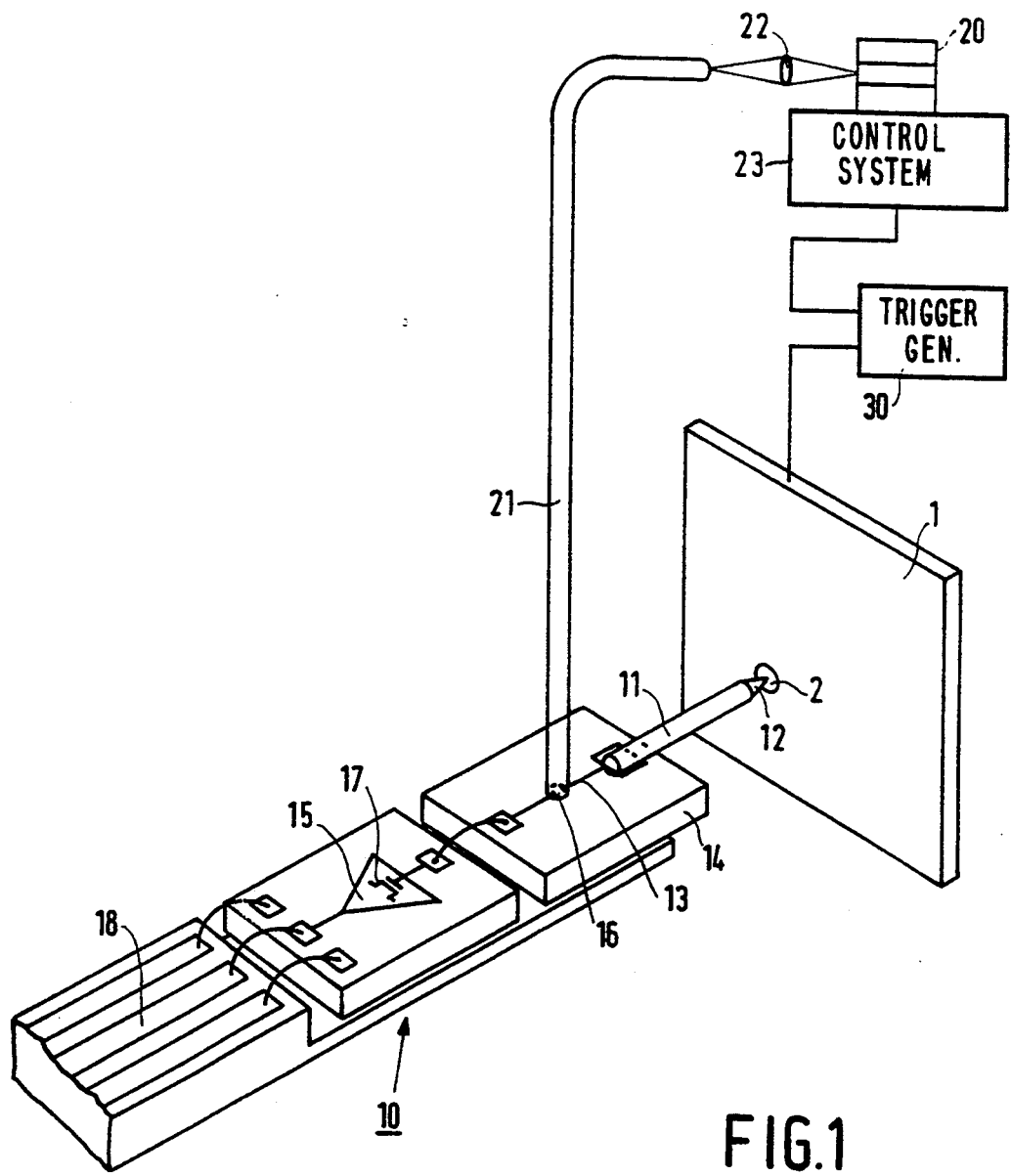
FIG. 1 shows an embodiment of a probe apparatus in accordance with the invention.

In FIG. 1, a first embodiment of a probe apparatus 10 in accordance with the invention is shown. A probe needle 11 with a tip 12 is placed in contact with a selected point 2 of an electrical circuit, for example, an integrated circuit. The electrical circuit is operated by applying a voltage supply and various signals to it, such as data input signals and clock signals. Electrical signals may also be imposed on the circuit by means of further probe needles. The probe needle 11 is coupled to a preamplifier 15 via a wire 13 on a substrate 14. The wire 13 is connected to a photoconductive switch 16. The photoconductive switch comprises a material, such as GaAs or another III-V semiconductor material, that is conductive when electromagnetic radiation impinges on it and that is isolating in the absence of such radiation. The photoconductive switch may also be another type of photosensitive switch, for example, a photoconductive transistor. The preamplifier 15 comprises, as an input transistor, a field effect transistor (FET), of which the input capacitance is used as a storage capacitor 17 for the electrical signal detected at the selected point 2 of the circuit 1. The photoconductive switch is operated by means of radiation pulses generated by a radiation source 20, for example, a semiconductor laser. The pulses are transmitted to the photoconductive switch 16 via an optical system, for example, consisting of an optical fibre 21 and a collimator lens 22. Alternatively, if a semiconductor-laser is used as a radiation source, it may be placed in direct contact with the substrate 14 close to the photoconductive switch 16 thereby Obviating the need for an extensive optical transmission system.

The radiation source 20 is connected to a control system 23 which controls the length and timing of the radiation pulses. Preferably, an input of the control system 23 is connected to a trigger signal generator 30 for generating trigger signals preceding the occurrence of the signals to be measured in the electrical circuit 1. Thereby, the generation of radiation pulses and the moment of measurement by connecting the probe apparatus can be synchronised with the operation of the electrical circuit 1. The control system 23 is further provided with means to adjust the moment of pulse generation to a certain phase of the operation cycle of the electrical circuit. These means can be used to perform multiple measurements at the same test point with different delay adjustments, providing a scan of the signal profile at that point.

The preamplifier 15 is connected via connections 18 to analysis equipment, for example, an oscilloscope or logic analyzer, not shown. For proper measurements the analysis equipment is provided with timing and trigger signals from the trigger generator 30 and the radiation source control system 23, or is arranged to adjust those signals. Also, the probe and the circuit tinder test have a common ground.

Figure 2A:
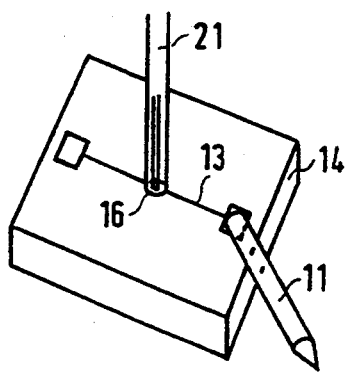
FIGS. 2a, 2b and 2c show three different ways to connect an optical fibre to a section of photoconductive material in order to obtain a photoconductive switch.
Figure 2B:
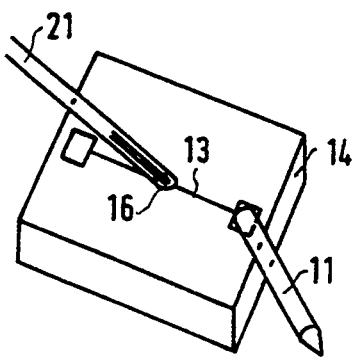
Figure 2C:
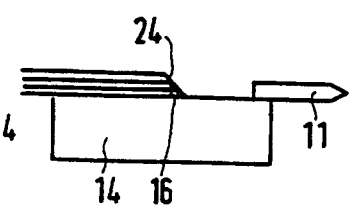

In FIGS. 2a, 2b and 2c, three possibilities for the connection of an optical fibre to the photoconductive switch 16 are shown. In the embodiment shown in FIG. 2a the end face of an optical fibre 21 is made perpendicular to the longitudinal direction of the fibre. The fibre is placed with its longitudinal direction perpendicular to the surface of the substrate 14 on which the conductive wire 13 and the photoconductive switch 16 are arranged. In FIG. 2b, the end face of the optical fibre 21 is slanted and the fibre is arranged at an angle on the substrate 114. To avoid reflections at the interface between the fibre and substrate, an anti-reflective layer may be arranged in between the fibre and substrate. In FIG. 2c the optical fibre 21 is provided with an end face 24 exhibiting an angle of about 45° to the direction of the fibre. Due to internal reflection the radiation transmitted in the fibre is reflected at this end face 24 and exits through the cladding. This allows the fibre 21 to be attached to the substrate 14 in parallel to the surface of the substrate of course, the positioning of the fibre end has to be such that the radiation leaving the fibre 21 reaches the substrate surface at the place where the photoconductive switch 16 is located.

Figure 3:
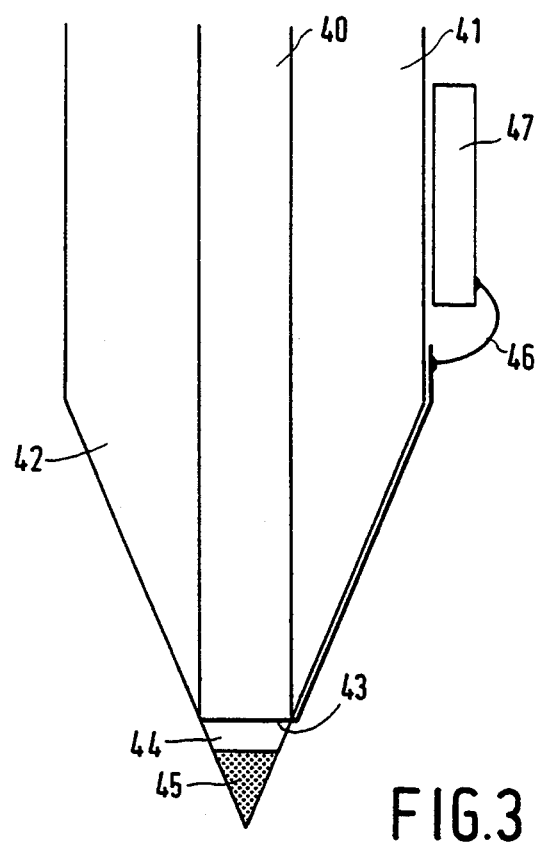
FIG. 3 is another embodiment of a probe apparatus in accordance with the invention.

FIG. 3 illustrates a very compact embodiment of a probe apparatus in accordance with the invention. The end of an optical fibre with a core 40 and a cladding 41 is provided with a taper 42, for example, by means of etching or pulling in a flame. On the tapered end a transparent electrical conductor 43 is arranged, for example, of indium-tin-oxide (ITO). On top of the transparent conductor 43 a layer 44 of a photoconductive material is deposited, for example, GaAs. The layer 44 separates the electrical conductor 43 from the contact point 45 of the probe. The latter is, for example, a tungsten contact formed by electroplating or laser deposition. The ITO conductor 43i is connected, via a wire 46, to the gate of a FET 47. The FET 47 acts both as a storage capacitance and as the input transistor of a preamplifier. As shown in the Figure, the FET is arranged on a small piece of semiconductor substrate; which may be attached by an adhesive to the cladding or the coating of the optical fibre.

Figure 4:
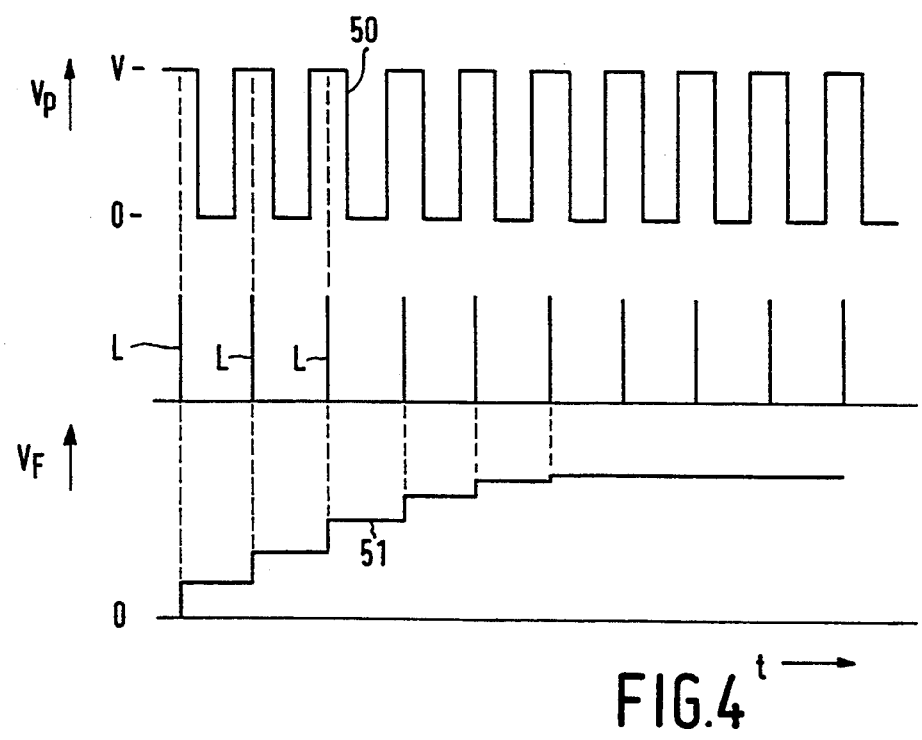
FIG. 4 provides an illustration of a measurement method in accordance with the invention.

In FIG. 4 a method for measuring a high frequency electrical signal using the probe apparatus is illustrated. The Upper curve 50 shows the voltage $V_p$ at a selected point of an electrical circuit under test as a function of time t. The value of the voltage at this point varies during an operation cycle which corresponds to several clock periods of the circuit. In a certain phase of a cycle the voltage, then having a value V, is to be measured. The photoconductive switch in the probe is made conductive by means of short radiation pulses L, the timing of which pulses is shown in the second line of FIG. 4. These pulses L are synchronised with the moment in a cycle at which the voltage V at the selected point is to be measured. As the radiation pulses make the photoconductive switch conductive for a short time, determined by the length of the pulses, some charge flows from the selected point into the storage capacitance formed by the input capacitance of the FET. Initially, the amount of charge withdrawn during one pulse is sufficient only for the partial charging of the storage capacitance. During later pulses additional charge flows into the capacitance. After a number of operation cycles, in each of which one radiation pulse is generated, the voltage at the storage capacitance has reached the value V to be measured The voltage $V_F$ at the input of the FET is shown in FIG. 4 as the lower curve 51. According to this method the voltage at a certain moment in the operation cycle of an electrical circuit can be measured accurately without disturbing the operation of the circuit, even if the circuit is operated at a high frequency. The size of the storage capacitance has no influence on the accuracy of the measurement as it will only determine the number of cycles needed to reach equilibrium. This may affect the total length of the measurement time. The actual measurement time will depend on other considerations as well.

We claim:

1. A probe apparatus for measuring electrical signals in an electrical circuit comprising: at least one electrical contact for contacting a selected point of the electrical circuit, said electrical contact being coupled to a first terminal of a switch that is responsive to electromagnetic radiation, means for generating high frequency pulsed electromagnetic radiation in synchronism with the electric signal being measured and applying said pulsed electromagnetic radiation to said switch for switching the switch, and wherein a second terminal of said switch is connected to a capacitance for storage of an electrical quantity tapped from said elected circuit point and the apparatus parameters are chosen so that it requires two or more pulses of electromagnetic radiation to charge said capacitance to the voltage level of an electric signal being measured at said selected circuit point.

2. A probe apparatus according to claim 1, wherein the capacitance is the input capacitance of a field effect transistor (FET).

3. A probe apparatus according to claim 2, wherein the FET is the input transistor of a pre-amplifier of the probe apparatus.

4. A probe apparatus according to claim 2, wherein the means for generating electromagnetic radiation comprises a control circuit for generating the radiation pulses synchronous with the occurrence of electrical signals to be measured in the electrical circuit.

5. A probe apparatus according to claim 4, wherein the control circuit generates pulses with a pulse length considerably shorter than one clock period for clocking the electrical circuit.

6. A probe apparatus according to claim 2 wherein said electrical contact is arranged adjacent one end of an optical fibre having its other end optically coupled to the means for generating electromagnetic radiation, and wherein a photoconductive material is arranged between the optical fibre and the electrical contact.

7. A probe apparatus according to claim 1 wherein said electrical contact is arranged at one end of an optical fibre having its other end optically coupled to the means for generating electromagnetic radiation, and wherein a photoconductive material is arranged between the optical fibre and the electrical contact.

8. A probe apparatus according to claim 1 wherein the means for generating electromagnetic radiation comprises a control circuit for generating the radiation pulses synchronous with the occurrence of electrical signals to be measured in the electrical circuit.

9. A probe apparatus according to claim 8, wherein the control circuit generates pulses with a pulse length considerably shorter than one clock period for clocking the electrical circuit.

10. A probe apparatus according to claim 8 wherein said electrical contact is arranged at one end of an optical fibre having its other end optically coupled to the means for generating electromagnetic radiation, and wherein a photoconductive material is arranged between the optical fibre and the electrical contact.

11. The probe according to claim 1 wherein said means for generating and applying electromagnetic radiation to said switch comprises a semiconductor laser coupled to the switch via an optical fiber.

12. The probe according to claim 1 wherein said means for generating and applying electromagnetic radiation to said switch comprises a semiconductor laser coupled to the switch and pulsed on and off in synchronism with the occurrence of electric signal voltages to be measured at said selected point of the electrical circuit whereby, after a number of laser pulses, the storage capacitance is charged to the voltage level of said electric signal voltages occurring at said selected point so that said storage capacitance does not load the electric circuit at said selected point.

13. A method for sampling electrical signals in an electrical circuit with a repeated operation cycle, which method comprises contacting a point of the electrical circuit by a probe comprising a contact coupled to a storage capacitance via a photoconductive switch, closing the switch during a plurality of time intervals (L), each time interval being considerably sorter than one clock period for clocking the circuit, and synchronizing the intervals in which the switch is closed with the operation cycle of the circuit by applying laser pulses thereto in synchronism with said operation cycle.

14. The method of claim 13 wherein it requires at least two laser pulses to charge the storage capacitor to the voltage level of said electric circuit point, said method comprising the further step of sampling the storage capacitance voltage only after it is charged to the voltage level of said electric circuit point.

15. A probe apparatus for measuring electric signals in an electric circuit comprising:
an elongate optical fiber element having an elongate internal light conductive core and an outer coating tapered at one end,
a transparent electric conductor arranged adjacent one end of the core which is located in the vicinity of said one tapered end;
an electric contact point located at the end point of said one tapered end,
a layer of photoconductive material sandwiched between the electric contact point and the transparent electric conductor, and
a field effect transistor supported on said optical fiber element and electrically connected to said transparent electric conductor so as to function both a as a storage capacitor and as an input transistor of a pre-amplifier.

* * * * *